United States Patent [19]

Dennis et al.

[11] 3,993,384

[45] Nov. 23, 1976

[54] CONNECTOR BLOCK

[75] Inventors: Richard Kay Dennis, Etters; Edward Leal Hadden, Mechanicsburg, both of Pa.

[73] Assignee: E. I. Du Pont de Nemours and Company, Wilmington, Del.

[22] Filed: May 12, 1975

[21] Appl. No.: 576,450

[52] U.S. Cl. .......................................... 339/17 CF
[51] Int. Cl.² ........................................ H05K 1/12
[58] Field of Search ................. 339/17 CF, 174; 174/52 FP

[56] References Cited
UNITED STATES PATENTS

| | | |
|---|---|---|
| 3,771,109 | 11/1973 | Bruckner et al. .................... 339/174 |
| 3,815,077 | 6/1974 | Anhalt et al. .................... 339/17 CF |
| 3,871,736 | 3/1975 | Carter ............................ 339/17 CF |
| 3,873,173 | 3/1975 | Anhalt .............................. 339/174 |
| 3,877,064 | 4/1975 | Scheingold et al. ............ 339/17 CF |
| 3,883,207 | 5/1975 | Tomkiewicz .................... 339/217 S |

*Primary Examiner*—Roy Lake
*Assistant Examiner*—Craig R. Feinberg

[57] ABSTRACT

A connector block for forming interconnections between contact pads on a flat leadless IC package and corresponding pads on a parallel circuit board. The block carries a number of terminals each having a collapsible linkage such that when the package is moved toward the circuit board, collapse of the linkage is controlled by a guide surface and wiped pressure connections are formed between the terminals and pads on both the substrate and the circuit board.

9 Claims, 5 Drawing Figures

CONNECTOR BLOCK

The invention relates to a connector block for forming electrical interconnections between printed circuit pads on a circuit board or like support and corresponding contact pads on an IC substrate or similar body mounted parallel to and spaced from the circuit board. The connector block includes a housing with metal terminals in the housing each having a collapsible toggle linkage with contacts at the ends of toggle legs. The block is mounted on the circuit board with one contact of each terminal engaging a pad on the board. Movement of the substrate toward the block brings contact pads on the substrate into engagement with the other terminal contacts to collapse the toggle linkages. The block includes a guide surface for each linkage so that as the substrate is moved toward the circuit board and the linkages are collapsed, the circuit board contact of each terminal is wiped along its printed circuit pad. At the same time, the collapse of the linkage rotates the substrate contacts on the substrate pads. The collapse of the linkage increases the contact pressure at each pad. The linkages and contacts of a terminal are secured to the insulating housing by a flexible portion which permits movement of the contacts with respect to a fixed terminal end to achieve the desired wiped pressure connection at both pads.

As leadless IC packages have been accepted in the electronics industry, the need has developed for a connector block for mounting packages parallel to a circuit board with terminals carried by the block forming electrical interconnections between contact pads on the substrate and printed circuitry on the board. Connector blocks of this type have been proposed where the terminals carried by the block include legs which are soldered to the circuitry on the circuit board. Such types of blocks are shown in U.S. Pat. Nos. 3,700,788; 3,754,203; and 3,771,109, and can be used for mounting substrates on circuit boards only where it is permissible to solder the block in place on the board.

A need has also been felt in the electronics industry for a connector block for mounting IC substrates parallel to a circuit board without solder connections. This type of a block carries terminals so that when it is attached to a circuit board, conventionally by bolts or lock pins, the terminals engage the printed circuitry on the board and are exposed for engagement with contact pads on the substrate when the substrate is subsequently mounted into the block. The electrical connections formed between the terminals and the contact pads on both the substrate and circuit board are of the pressure type where the contact is biased against the pad. Because impurities ma form on both the pads and terminal contacts, the industry has long recognized the desirability of wiping the mating surfaces during the forming of the connection so that the frictional skidding breaks up impurities and an intimate clean metal-to-metal contact is formed.

Connector blocks which are mounted on circuit boards for subsequent reception with a ceramic substrate are shown in U.S. Pat. Nos. 3,873,173 and 3,877,064. In each of these blocks a wiped pressure connection is formed between the terminals carried by the block and the pads on the circuit board at the time the block is mounted on the board. When the substrate is mounted in the block, a wiped electrical connection is formed only between the terminals in the block and the pads on the substrate. At this time, wiping does not occur between the terminal contacts and the pads on the circuit board and there is no assurance that clean wiped pressure connections exist at the connections between the terminals and the pads on the circuit board. During the interval between mounting of the connector block on the circuit board and the subsequent positioning of the substrate in the block, impurities may form at the connection between the terminals and the circuit board pads.

Our copending application for "Leadless Package Retaining Frame," U.S. Ser. No. 522,925, filed Nov. 4, 1974, discloses another type of substrate mounting block where movement of the substrate into the block forms a wiped connection between terminals in the block and pads on both the substrate and the circuit board.

Other objects and features of the invention will become apparent as the description proceeds, especially when taken in conjunction with the accompanying drawings illustrating the invention, of which there are two sheets.

IN THE DRAWINGS

Figure 1:
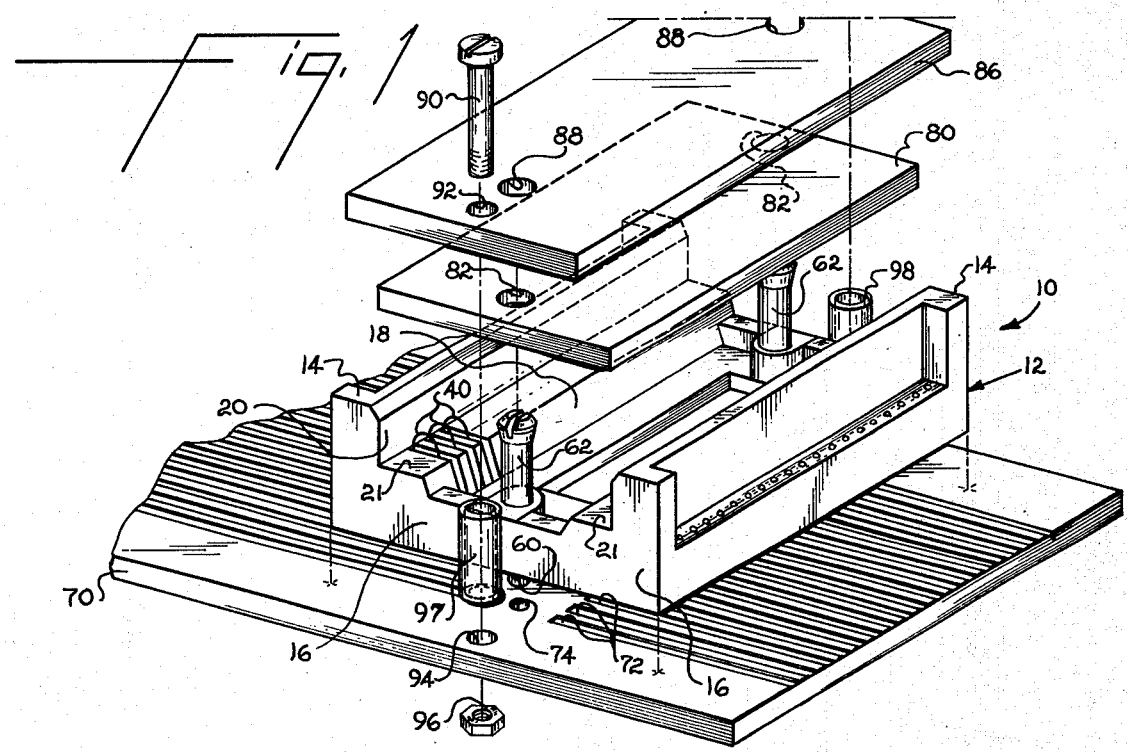
FIG. 1 is a perspective view of a connector block according to the invention indicating the relative positions of the circuit board, connector block, substrate, and hold down plate.

Connector block 10 includes a rectangular housing 12 formed of an insulating material, preferably a molded plastic. Housing 12 has opposed side walls 14, opposed end walls 16, and a central recess 18 located between the inner surfaces 20 of side walls 14. The recess 18 is open at the ends of the housing. Shoulders 21 run the length of the housing and extend inwardly from surfaces 20.

Figure 2:
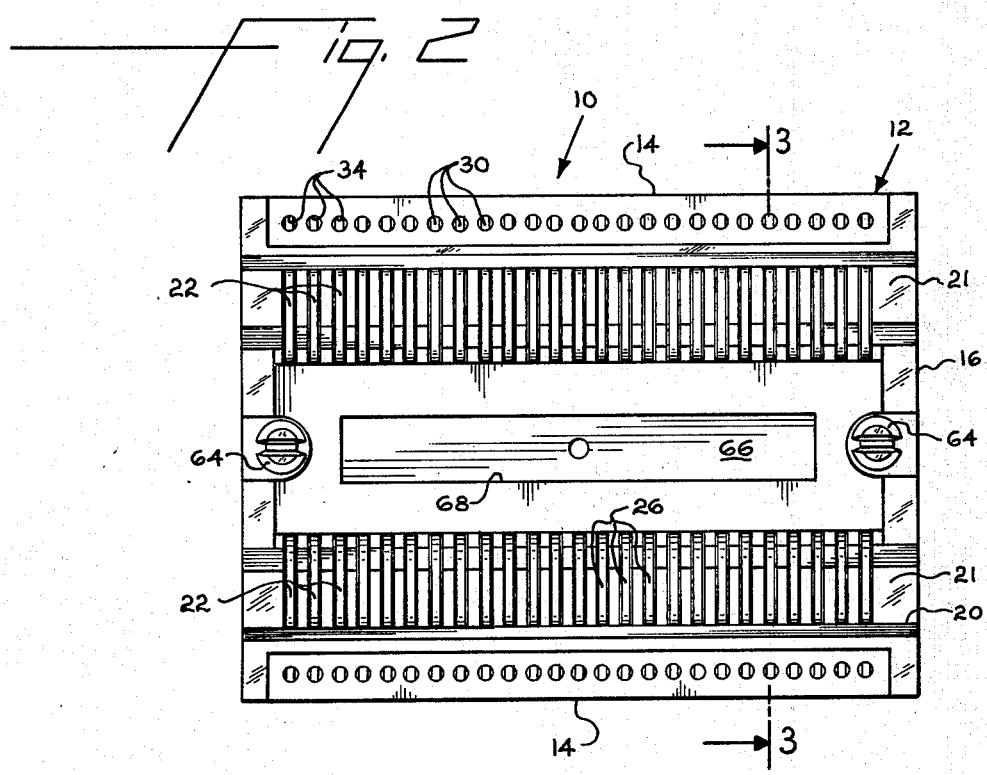
FIG. 2 is a top view of the connector block.
Figure 3:
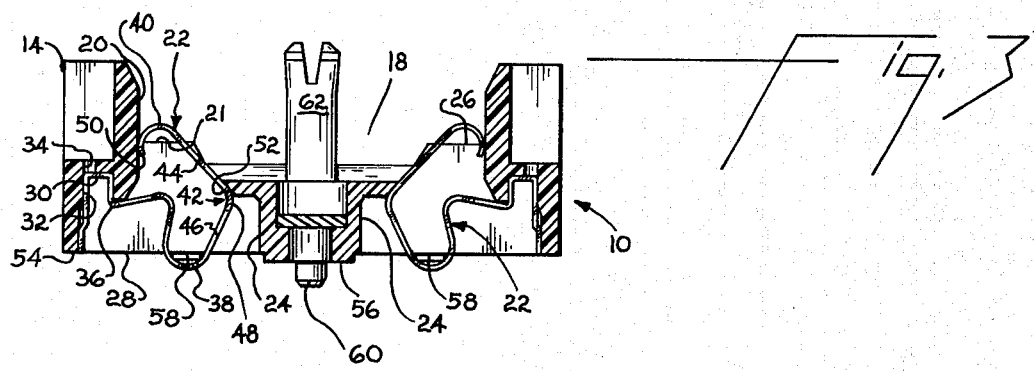
FIG. 3 is a sectional view taken along line 3—3 of FIG. 2.

As illustrated in FIG. 2, a series of terminals 22 extends along each side of the housing. Each terminal 22 is confined in an individual terminal recess 24 in the housing. The recesses 24 communicate the central recess 18 with the space beneath the housing through upper or substrate opening 26 and lower or circuit board opening 28. The terminals 22 are preferably formed from lengths of spring metal stock bent to be fitted within the recesses 24 in the shape as illustrated in FIG. 3. End portion 30 of each terminal is U-shaped and fits snugly within a pocket 32 in the recess 24 adjacent side wall 14. A test probe opening 34 extends through the thickness of the side wall to permit insertion of a contact probe for checking the electrical properties of the terminal when the block is secured to a circuit board and electrical connections are established between pads on the board and pads on the substrate held in the block. Physical engagement between the probe and terminal does not alter the electrical connections between the terminal and the circuit board and substrate pads.

A collapsible connecting terminal portion 36 joins the confined terminal end 30 with bowed circuit board contact 38 which extends outwardly of the lower or circuit board opening 28. Circuit board contact 38 is joined to bowed substrate contact 40 by a toggle linkage 42 comprising a pair of straight toggle legs 44 and 46 which join at bend or elbow 48. Leg 44 extends between contact 40 and the elbow 48 and leg 46 extends between contact 38 and the elbow. Contact 40 projects outwardly from the upper or substrate opening 26 above shoulder 21. The free end 50 of the terminal adjacent contact 40 rests flush upon the extension of inner surface 20 into the terminal recess 24. The terminal elbow or bend 48 of toggle linkage 42 engages guide surface 52 on the side of the recess away from wall 14.

A central standoff 56 and side standoffs 58 project below the lower surface 54 of the housing to space openings 28 above the surface of the circuit board on which the housing is mounted. A par of locating pins 60 project below pad 56 to locate the board in corresponding holes in the circuit board. A spaced pair of upper pilot pins 62 project upwardly from end walls 16. Notched pin ends 64 are outwardly flared for frictional engagement with the mounting plate. An elongate clamp plate 66 is seated in a step in lower recess 68 to facilitate mounting the block on the circuit board.

Figure 4:
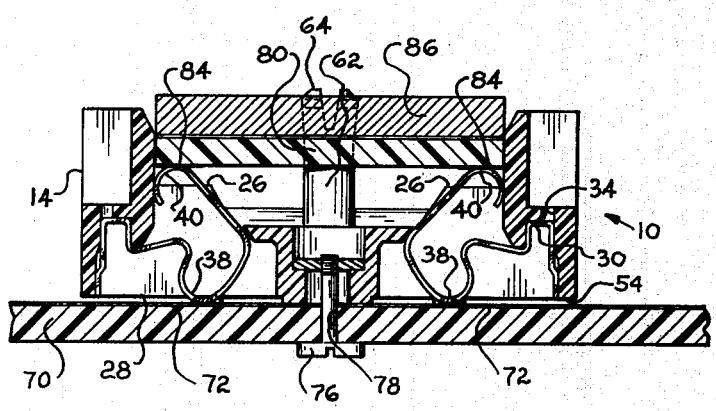
FIG. 4 is a sectional view taken through the block showing the block positioned on a circuit board with a substrate and hold down plate mounted loosely on the block.

The block is positioned on circuit board 70 in proper alignment with respect to the two rows of contact pads 72 located thereon by piloting pins 60 into holes 74 (only one of which is illustrated) extending into the board and then securing the block to the board by means of screw 76 extending through a hole 78 in the board for threadable engagement with a hole in plate 66. Standoffs 56 and 58 are held flush on the surface of the board 70 as shown in FIG. 4 and the circuit board contacts 38 of each terminal 22 rest on individual circuit board contact pads 72.

When the block 10 is free of the circuit board, the crests of bowed contacts 38 extend below standoffs 56 and 58. As the block is drawn down to seat the standoffs on the circuit board, the contacts 38 are brought into engagement with the circuit board contact pads and, with further movement of the block toward the board, are wiped along the pads in a direction toward the housing side walls. The surfaces 52 prevent upward movement of the elbows during mounting of the block on the circuit board. Flexible terminal connecting portions 36 partially collapses during this operation.

Figure 5:
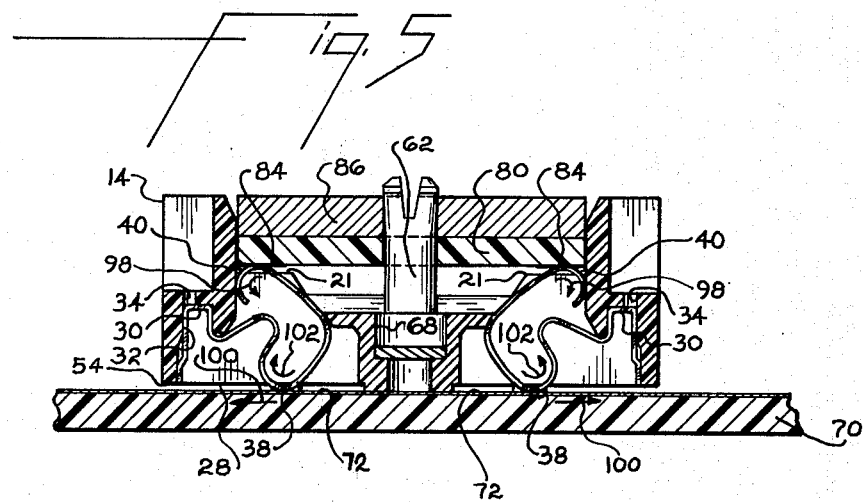
FIG. 5 is a view like FIG. 4 following tightening down of the hold down plate and forming of electrical connections between pads on the substrate and contact pads on the circuit board.

With the block 10 secured to circuit board 70, a ceramic substrate 80 or a similar member, is moved into the central recess 18 with pins 62 extending through holes 82 at either end of the substrate. A series of substrate contact pads 84 are spaced along the sides of the substrate surface facing the recess 18 so that when the substrate is in the central recess, each substrate pad rests on a bowed substrate contact 40 extending above a shoulder 21. The substrate carries integrated circuit components (not illustrated) which are connected to the substrate pads 84. A hold down plate 86 is fitted over the substrate so that the ends of pins 62 extend into holes 88 in the plate. The plate and substrate are then moved down into the central recess of the block by means of a pair of screws 90 extending through holes 92 in the plate located outwardly of the ends of the substrate and complimentary holes 94 extending through the circuit board 70. Nuts 96 are secured to the ends of the screws extending through the circuit board to draw down the plate and substrate into the block 10 to the position of FIG. 5. If desired, spacers 97 may be used to control the depth to which the substrate and plate are moved into the block. Clearly, other clamps or hold downs may be used for drawing the substrate down into the central recess against the contacts 40.

As the substrate 80 is drawn down toward the circuit board 70, the contact 40 of each terminal 22 is moved down into its respective recess 24 and the terminal toggle linkage 42 is collapsed. The spring properties of the terminal resist the collapse and bias the terminal end against the substrate pad 84 and the continuation of surface 20 so that, as the substrate lowers, the terminal end rotates in the corner defined by the pad and the surface of the housing in a direction indicated by arrows 98 in FIG. 5. This rotation of the terminal end wipes or skids bowed contact 40 on its respective pad 84 on the substrate and, together with the contact pressure due to collapse of the toggle linkage, assures that a desirable wiped pressure connection is formed between the contact and pad.

During collapse of the toggle linkage 42, guide surface 52 prevents the elbow 48 from rotating with leg 46 about the point of engagement between the contact 38 and pad 72. The elbow moves in a direction having a component directed toward the initial point of engagement between contact 38 and pad 72, thereby reducing the distance between the elbow and the initial point of engagement and forcing contact 38 to move along the surface of the circuit board pad 72 outwardly toward wall 14. Such movement wipes or skids the contact 38 along the surface of pad 72 in the direction of arrow 100 shown in FIG. 5. The contact 38 also rotates in the direction of arrow 102 as it is moved outwardly along the surface of the circuit board pad. The rotation is opposite or retrograde in direction to that which would occur if the bowed contact were rolled along the surface of the circuit board pad and wipes or skids the point of engagement along the surface of contact 38. The wiping of the point of engagement along the surfaces of both contact 38 and circuit board pad 72, together with the increased contact pressure resulting from the collapse of the toggle linkage assures that a double wiped pressure connection is formed between the terminal 22 and the circuit board pad 72. The connecting terminal portion 36 flexes during collapse of the toggle linkage, thereby permitting the outward movement of contact 38 as described. Terminal end portion 30 remains attached to the housing. During collapse of the toggle linkage, the entire linkage, including the legs 44 and 46 and the elbow 48 is stressed, permitting use of a smaller terminal and reduced block height for a given desired contact pressure.

The toggle linkage 42 joining contacts 38 and 40 extends to one side of a straight line between the points of engagement of the contacts 38 and 40 with their pads so that as the substrate is moved into the central recess and the linkage is collapsed, the central portion of the linkage is biased away from the line joining the points of engagement but the guide surface 52 faces recess 28 and resists such movement so that the lower terminal contact 38 is wiped or skidded across the circuit board contact pad 72 at the recess.

The guide surface 52 need not engage the sharp bend or elbow of the toggle linkage but may be positioned to engage another part of the linkage so that, upon collapse, the lower contact is forced to move with respect to the circuit board pad and form a wiped pressure connection therewith. For instance, a guide surface could be positioned to engage the end of toggle leg 44 adjacent the elbow so that the wiping as described would result upon collapse of the linkage.

While we have illustrated and described a preferred embodiment of our invention, it is understood that this is capable of modification, and we therefore do not wish to be limited to the precise details set forth, but desire to avail ourselves of such changes and alterations as fall within the purview of the followng claims.

We claim:

1. A connector block for forming electrical interconnections between pairs of spaced contact pads or the like, said connector block comprising an insulating housing, a series of terminal recesses in the housing, a first and a second opening in each recess communicating the interior of the recess with the exterior of the housing and a surface to one side of the first opening; a terminal in each recess, each terminal being formed from a length of spring metal and including first and second bowed contacts extending outwardly of the housing through said first and second openings respectively, a toggle linkage joining said contacts and including a pair of toggle legs and an elbow, each leg extending from one contact to the elbow, a portion of the terminal adjacent the first contact engaging said surface during collapse of the linkage, the elbow being located on the side of a straight line joining said contacts away from said surface so that when the toggle linkage is collapsed by movement of a contact pad engaging the first contact toward the recess, the elbow is moved away from the line; and the housing including a fixed terminal guide surface in each recess facing the second opening thereof and engagable with the toggle linkage upon collapse of the linkage to force the second contact along the surface of a fixed contact pad adjacent the second opening to form a wiped electrical connection therebetween.

2. A connector block as in claim 1 wherein each recess includes a terminal mounting pocket, and a test probe opening extending through a wall of the housing and communicating the interior of the pocket with the exterior of the housing; and each terminal includes a mounting portion secured in the pocket in its respective recess and a flexible connecting portion joining said mounting portion to one of said contacts.

3. A connector block as in claim 2 wherein each connecting portion joins a mounting portion to a second contact.

4. A connector block for forming electrical interconnections between a pair of spaced contact surfaces, said connector block comprising an insulating housing, a terminal recess in the housing, first and second openings communicating the interior of the recess with the exterior of the housing; a terminal in the recess, the terminal being formed from a length of spring metal and including first and second contacts located at the first and second openings respectively, a collapsible linkage joining said contacts and extending to one side of a straight line between the contacts so that when the linkage is collapsed by moving a contact surface against the first contact to move such contact toward the recess, the central portion of the linkage is flexed away from the line; and the housing including a fixed terminal guide surface in the recess facing the second opening and engaged by said central portion of the linkage whereby, upon collapse of the linkage, the second contact is forced to wipe along the surface of a fixed contact pad adjacent the second opening.

5. A connector block as in claim 4 wherein said linkage includes a pair of legs joining at an elbow, said guide surface engaging the linkage adjacent the elbow.

6. A connector block for forming an electrical interconnection between adjacent contact pads or like conductive members, the connector block comprising a terminal housing; a terminal held by the housing, said terminal being formed of spring metal and including a pair of spaced contacts each having a surface exposed for engagement with a contact pad or like conductive member, and a collapsible linkage joining said contacts and located to one side of a straight line extending between the contacts so that movement of one contact toward the other contact by a contact pad or like conductive member collapses the linkage and moves the linkage further away from the line; the housng including a fixed guide surface located further away from the line than the linkage and engaged by a central portion of the linkage during the collapse of the linkage to control the movement of the other contact with respect to a fixed contact pad or like conductive member engaging the other contact so that a wiped pressure connection is formed therebetween during collapse of the linkage.

7. A connector block as in claim 6 wherein said linkage comprises a pair of legs each extending from one of said contacts and joining at an elbow located on said side of the line, the guide surface is located on the terminal housing facing the other contact and, during collapse of the linkage, the guide surface prevents rotation of the elbow and leg joining the other contact about the point of engagement between such contact and the fixed contact pad.

8. A connector block as in claim 7 wherein the terminal includes a mounting portion secured to the housing and a flexible connection portion extending between said mounting portion and one of said spaced contacts such that the flexible portion isolates the mounting portion from movement during collapse of the linkage.

9. A connector block as in claim 8 wherein the flexible connecting portion joins said other contact.

* * * * *